United States Patent [19]

Pitt et al.

[11] Patent Number: 4,656,750
[45] Date of Patent: Apr. 14, 1987

[54] HEADING SENSOR

[75] Inventors: Gilles D. Pitt, Saffron Walden; Philip Extance, Cambridge; David Wilson, Bishops Stortford, all of United Kingdom

[73] Assignee: Standard Telephones and Cables Public Limited Company

[21] Appl. No.: 736,835

[22] Filed: May 22, 1985

[30] Foreign Application Priority Data

May 23, 1984 [GB] United Kingdom ............... 8413226

[51] Int. Cl.⁴ ............................................. G01C 17/02
[52] U.S. Cl. ......................................... 33/352; 33/354; 33/361; 33/366; 73/178 R; 73/517 R; 324/247; 324/251
[58] Field of Search ...................... 73/178 R, 493, 510, 73/517 R, 517 B; 33/352, 361, 366, 354; 324/247, 251; 338/32 H

[56] References Cited

U.S. PATENT DOCUMENTS 3,197,880  8/1965  Rice et al. ........................ 324/251
3,304,787  2/1967  Chiku et al. ..................... 73/517 R
3,899,834  8/1975  Harrison ............................. 33/352
4,212,443  7/1980  Duncan et al. .................. 73/178 R
4,483,194  11/1984 Rudolf .............................. 73/517 B

OTHER PUBLICATIONS

Ross et al., "The Hall-Effect Compass", Journal of Scientific Instruments, vol. 34, Dec. 1957, pp. 479-484.

Primary Examiner—Stewart J. Levy
Assistant Examiner—John E. Chapman, Jr.
Attorney, Agent, or Firm—Kerkam, Stowell, Kondracki & Clarke

[57] ABSTRACT

A solid-state heading sensor is comprised by a three-axis Hall effect magnetometer and a three-axis accelerometer. The magnetometer is comprised by a cube-like structure (10) of non-magnetic material on each of three orthogonally related faces of which is located a respective Hall effect device (11, 12, 13), for example of GaAs. The three-axis accelerometer may be comprised by a three-axis module (15) disposed in a recess in the cube-like structure, or by three separate accelerometer structures (23, 24, 25), for example planar etched silicon accelerometers, each disposed on a respective one of the orthogonally related faces adjacent the Hall effect device (20, 21, 22) thereon.

15 Claims, 9 Drawing Figures

HEADING SENSOR

BACKGROUND OF THE INVENTION

This invention relates to a heading sensor and in particular to a heading sensor incorporating Hall effect devices.

SUMMARY OF THE INVENTION

According to one aspect of the present invention there is provided a heading sensor comprising a three-axis Hall effect magnetometer in combination with a three-axis accelerometer.

According to another aspect of the present invention there is provided a heading sensor comprising a cube-like structure of a non-magnetic material on each of three orthogonally related faces of which is located a respective Hall effect device, which cube and Hall effect devices constitute a three-axis magnetometer, and comprising a three-axis accelerometer, each of the three axes of the magnetometer being aligned with a respective one of the three axes of the accelerometer.

BRIEF DESCRIPTION OF THE DRAWINGS

Embodiments of the invention will now be described with reference to the accompanying drawings, in which.

DESCRIPTION OF THE PREFERRED EMBODIMENTS

Figure 2:
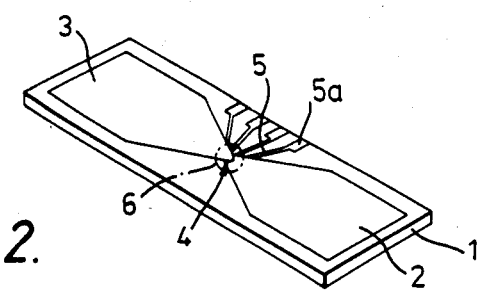
FIG. 2 shows a single axis Hall effect device.

The single axis Hall effect device illustrated in FIG. 2 comprises an alumina substrate 1, a first or lower thin-ribbon-form metallic glass flux concentrator 2 with a tapered end portion, a second or upper thin-ribbon-form metallic glass flux concentrator 3 with a tapered end portion and a GaAs Hall effect chip (not visible in the drawing) disposed between the overlap 4 of the end portions of the flux concentrators 2 and 3. The flux concentrators 2 and 3 may be bonded to the alumina substrate with their tapered end portions overlapping and the chip 4 disposed therebetween. The chip may be bonded to one or both flux concentrators but is not electrically connected thereto. The Hall effect chip has four electrodes which may be coupled by interconnection wires (not shown) to conductive tracks 5, comprised by screen-printed thick film conductors, disposed on the substrate 1. Associated with each conductive track 5 is a contact pad 5a disposed on the substrate and for use in external connection of the Hall effect device. The Hall chip has two electrodes for current input and two electrodes for Hall voltage output, which output is available in use in the presence of a transverse magnetic field i.e. longitudinally of the flux concentrators, the tapering of the concentrators serving to "funnel" magnetic flux into the chip disposed between the tapered end portions of the concentrators.

The interconnection wire bonds to the chip and the tracks are protected by an encapsulation coating of, for example, a silicone resin 6.

Figure 3:
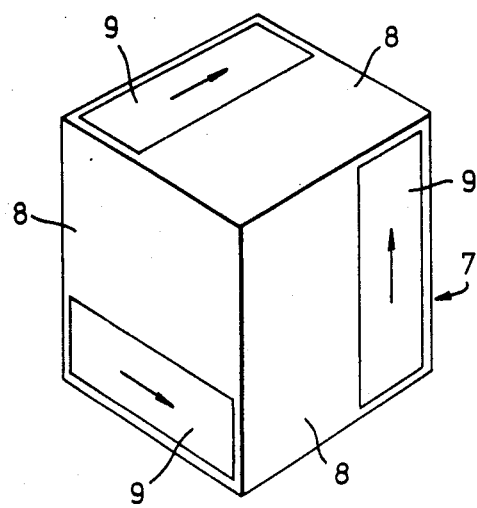
FIG. 3 illustrates schematically a three-axis Hall effect magnetometer.

By disposing three single-axis Hall effect devices, such as the devices of FIG. 2, relative to one another such that they respond to magnetic flux in three directions, that is the concentrators point in three directions which are mutually perpendicular, a three-axis magnetometer may be obtained. FIG. 3 illustrates an embodiment of a three-axis magnetometer, it comprises a cube 7 of non-magnetic material, for example aluminium, with accurately machined orthogonal faces 8, and on each of three of said faces 8 is disposed a respective single axis Hall effect device 9 arranged to be responsive to a respective magnetic flux direction, that is with the flux concentrators of FIG. 2 type Hall effect devices aligned with three mutually perpendicular axes as indicated by the arrows.

From the outputs of the Hall effect devices of a three-axis magnetometer the relative direction of a magnetic field can be calculated. In order to act as a heading sensor it is the Earth's magnetic field whose direction is required and for a calculated direction to be meaningful as a heading the orientation of the cube relative to the Earth's surface must be known and taken into account in the field direction calculation. A three-axis accelerometer may be employed to determine the altitude of a body with respect to the Earth's gravitational field. In order to provide a heading sensor, therefore, a three-axis magnetometer may be combined with a three-axis accelerometer, the latter being used to sense the direction of the Earth's gravitational field.

Figure 1:
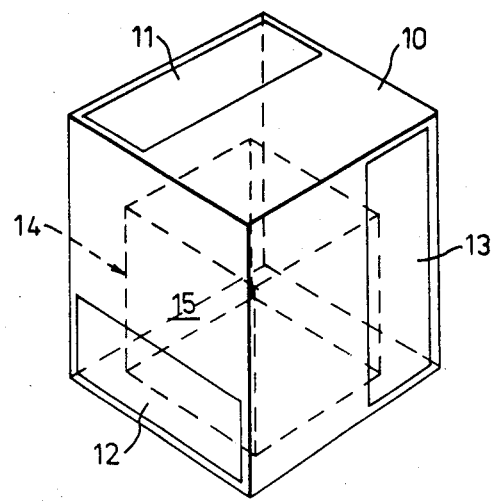
FIG. 1 illustrates schematically an embodiment of heading sensor comprising a three-axis Hall effect magnetometer and a three-axis accelerometer

FIG. 1 illustrates, schematically, a heading sensor comprising a three-axis Hall effect magnetometer comprising a cube 10 of aluminium or other non-magnetic material on three different faces of which are mounted three single-axis mutually perpendicular Hall effect magnetometer devices 11, 12 and 13.

The cube 10 includes a recess 14 opening at another face. Inside the recess 14 is disposed a three-axis accelerometer assembly 15 which is mounted with its measuring axes the same as the magnetometer axes. The accelerometer assembly may be comprised, for example, by an ENTRAN piezoresistive three-axis module with an edge size of 0.5″ (1.27 cm) and three ±5 g range devices. Alternatively the accelerometer assembly 15 may be comprised by a cube element bearing three etched silicon accelerometers as described hereinafter.

Figure 4:
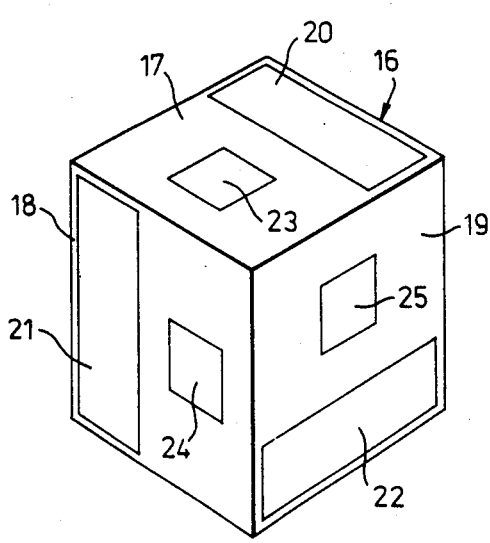
FIG. 4 illustrates schematically an alternative embodiment of heading sensor.
Figure 5:
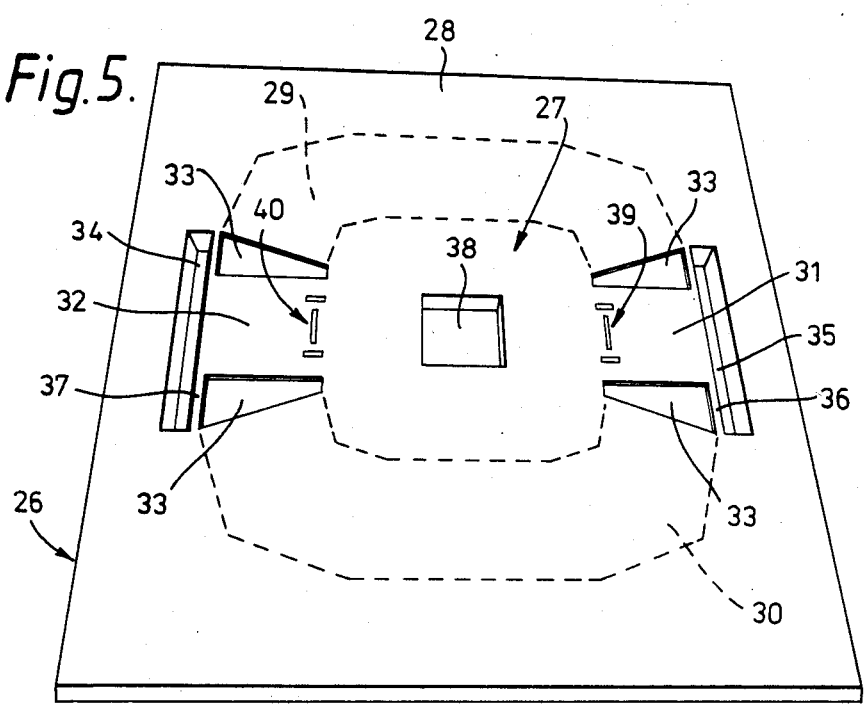
FIGS. 5 and 6 show, respectively, a top and a bottom view of an embodiment of silicon accelerometer.
Figure 6:
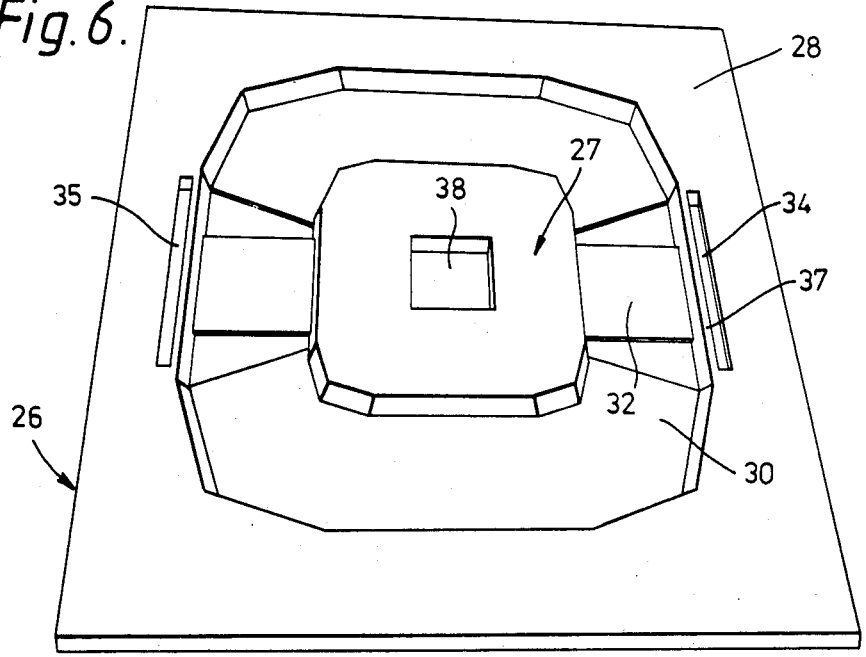
Figure 7:
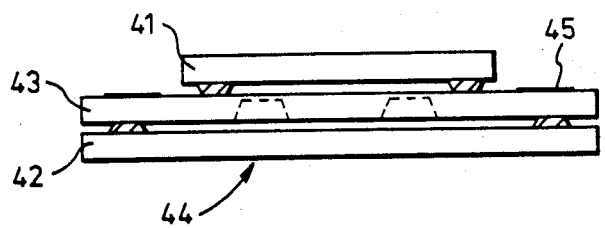
FIG. 7 shows a side view of a silicon accelerometer assembly with end stops.

FIG. 4 illustrates, schematically, a heading sensor comprising a cube 16 of aluminium or other non-magnetic material on three different surfaces 17, 18 and 19 of which are mounted three single-axis mutually perpendicular Hall effect magnetometer devices 20, 21 and 22, and on each of the three surfaces 17, 18 and 19 is mounted a respective planar geometry thin silicon accelerometer 23, 24 and 25. An example of a suitable etched silicon accelerometer is shown in FIGS. 5 (top view) and 6 (bottom view). It is formed, by anisotropic selective etching, from a laminar body 26 of single crystal silicon using, for example, an etch solution of comprising catechol, ethylene diamine and water, or potassium hydroxide and isopropyl alcohol, after suitable masking. The body 26 is etched to provide a seismic mass 27 coupled to a frame 28 by thin webs 29 and 30 and by two thin beams 31 and 32. The body 26 is etched completely through at four regions 33 thus separating the beams 31 and 32 from the webs 29 and 30. The body is also etched completely through within the frame 28 and in the vicinity of the beams 31 and 32 to form two slots 34 and 35, thus providing flexible constraints (hinges) 36 and 37 for the ends of the beams. An aperture 38 may be etched completely through the seismic mass 27 if required in order to control the weight and thus response of the seismic mass. Disposed on the upper surface of the body at the end of each of beams 31 and 32 adjacent where they join the seismic mass 27 is a respective strain gauge 39 and 40 whose outputs provide a measure of the movement of the seismic mass due to gravity. Such accelerometers can be made as single crystal silicon bodies approximately 0.5 inches square (1.27 cm square) and approximately 0.077 inches (0.043 cm) thick. In order to provide overrange capability the seismic mass of the body 26 may be disposed between two silicon end stop plates 41 and 42 bonded on opposite sides of the accelerometer chip 43 as illustrated in FIG. 7, which restrict the movement of the seismic mass and also somewhat to encapsulate the accelerometer chip 43 and to provide an accelerometer assembly 44. Conductive tracks (not shown in FIG. 5) are disposed on the surface of the body 26 in order to provide current input to the strain gauges and to tap the strain gauge output. These conductive tracks extend to contact pads such as 45 at the exterior surface of the accelerometer assembly.

Figure 8:
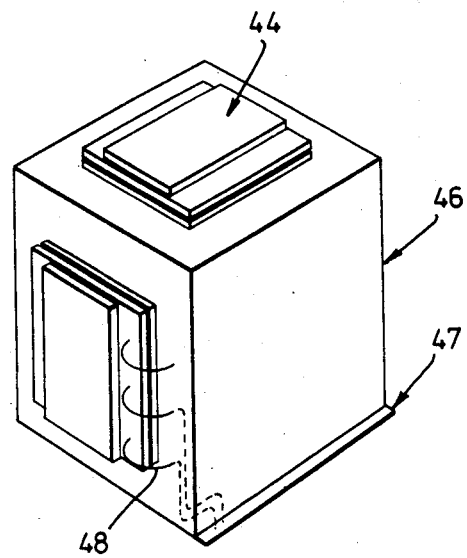
FIG. 8 illustrates a triaxial accelerometer assembly which can be employed in the FIG. 1 sensor embodiment.

In order to provide a triaxial accelerometer assembly using single axis etched silicon accelerometer assemblies 44 as described with reference to FIG. 7, three such assemblies 44 are mounted to respective mutually perpendicular faces of a non-magnetic cube 46. FIG. 8 illustrates a view of such a three-axis accelerometer, only two accelerometer assemblies 44 are, however, visible. The respective contact pads of the three assemblies 44 may lead to respective pads on a portion 47 of the cube 46 such as via connecting wires 48 to facilitate wiring of the assembly with a three-axis magnetometer in which it is disposed. If the cube 46 is of glass the silicon assemblies 44 may be bonded to it by the Mallory bonding process. The accelerometers and the Hall effect devices can be driven with constant current and connected in series with each other, thus facilitating assembly. The six outputs (three from the accelerometers and three from the Hall effect magnetometers) are processed in order to give the Earth's magnetic field direction with respect to the Earth's gravitational field.

Figure 9:
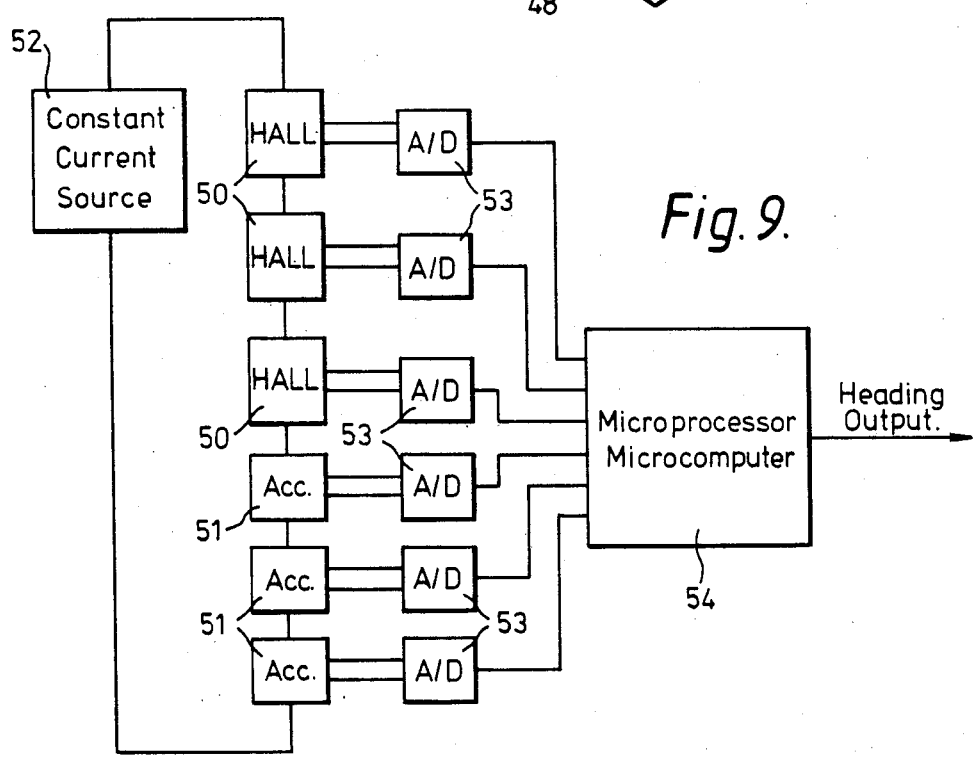
FIG. 9 illustrates an electrical block circuit diagram for determining a heading.

A possible block circuit diagram for such a device is shown in FIG. 9. Three Hall effect devices 50 are connected in series with three accelerometers 51 and with a constant current source 52. Thus a single current source is employed to drive all the sensors in this arrangement. The outputs of the sensors 50 and 51 are digitised either, and as shown, by separate analogue to digital converters 53, or multiplexing to a single analogue to digital converter. The digital outputs can then be processed by a dedicated microprocessor, or by a microcomputer 54. The algorithms necessary to process the data are essentially comprised of 3-D geometrical transformers.

Whereas etched silicon accelerometers have been described the invention is not to be considered so limited, etched accelerometers of other semiconductor materials may alternatively be used, for example of gallium arsenide. Whereas GaAs Hall effect devices have been described above, silicon Hall effect devices may alternatively be employed.

TECHNICAL ADVANTAGES

The heading sensors of the present invention have the basic advantages of small size combined with a high degree of accuracy of heading measurement.

We claim:

1. A heading sensor comprising a cube-like structure of non-magnetic material on each of three orthogonally related faces of which is located a respective Hall effect device, which cube and Hall effect devices constitute a three-axis magnetometer, and comprising a three-axis accelerometer, each of the three axes of the magnetometer being aligned with a respective one of the three axes of the accelerometer, the three-axis accelerometer comprising three etched semiconductor accelerometers, one for each of the three axes of the accelerometer, wherein the three-axis accelerometer comprises a three-axis module disposed in a recess in the cube-like structure, and wherein the three-axis module comprises a further cube-like structure on each of three orthogonally related faces of which is located a respective one of said three etched semiconductor accelerometers.

2. A heading sensor as claimed in claim 1, wherein the accelerometers comprise planar etched silicon accelerometers.

3. A heading sensor as claimed in claim 1, including gallium arsenide Hall effect devices with magnetic flux concentrators.

4. A heading sensor as claimed in claim 1, wherein said cube-like structure is of aluminium.

5. A heading sensor comprising a cube-like structure of a non-magnetic material on each of three orthogonally related faces of which is located a respective Hall effect device, which cube and Hall effect devices constitute a three-axis magnetometer, and comprising a three-axis accelerometer, each of the three axes of the magnetometer being aligned with a respective one of the three axes of the accelerometer, the three-axis accelerometer comprising three etched semiconductor accelerometers, one for each of the three axes of the accelerometer, and wherein each of the three etched semiconductor accelerometers is located on a respective one of the three orthogonally related faces of the cube-like structure.

6. A heading sensor comprising a three-axis Hall effect magnetometer arranged to respond to magnetic flux in three mutually perpendicular axes for determining the relative direction of a magnetic field, a three-axis accelerometer arranged to respond to the direction of the Earth's gravitational field along said three mutually perpendicular axes, and means for operatively interconnecting said magnetometer and said accelerometer to provide a heading output signal, wherein said magnetometer comprises three Hall effect devices each corresponding to one of said magnetometer axes, wherein said accelerometer comprises three semiconductor accelerometer devices, each corresponding to one of said axes, and wherein the interconnecting means connects said Hall effect devices and semiconductor devices electrically in series.

7. A heading sensor as set forth in claim 6 wherein said magnetometer and said accelerometer includes outputs corresponding to each of said axes and said means for operatively interconnecting said magnetometer and said accelerometer include means for processing said output to provide an output corresponding to the Earth's magnetic field direction with respect to the Earth's gravitational field.

8. A heading sensor as set forth in claim 6 further including a single constant current source connected for driving said Hall effect devices and said semiconductor device.

9. A heading sensor as set forth in claim 6 wherein each of said Hall effect devices and each of said semiconductor devices include an output and further including means for digitizing said outputs.

10. A heading sensor as set forth in claim 9 wherein said means for digitizing includes a separate analogue to digital converter connected to each output of said Hall effect devices and said semiconductor devices.

11. A heading sensor as set forth in claim 9 wherein said means for digitizing includes a single analogue to digital converter and multiplexing means connected to receive the outputs of said Hall effect devices and said semiconductor devices and having an output connected to an input of said analogue to digital converter.

12. A heading sensor as set forth in claim 6 including a cube-like structure of a non-magnetic material having three orthogonally related faces, a respective Hall effect device being located on each of the faces, each of the three axes of the Hall effect devices being aligned with a respective one of the three axes of the semiconductor devices.

13. A heading sensor as claimed in claim 12 wherein the three axis accelerometer comprises a three-axis module disposed in a recess in the cube-like structure.

14. A heading sensor as claimed in claim 13, wherein the three-axis module comprises a further cube-like structure on each of the three orthogonally related faces of which is located a respective etched semiconductor accelerometer.

15. A heading sensor as claimed in claim 12, wherein the three-axis accelerometer is comprised of three separate etched semiconductor accelerometers, each of which is located on a respective one of the three orthogonally related faces of the cube-like structure.

* * * * *